(12) United States Patent
Kirchgessner et al.

(10) Patent No.: US 11,817,486 B2
(45) Date of Patent: Nov. 14, 2023

(54) SEMICONDUCTOR DEVICE AND METHOD OF MAKING A SEMICONDUCTOR DEVICE

(71) Applicant: NXP USA, Inc., Austin, TX (US)

(72) Inventors: James Albert Kirchgessner, Tempe, AZ (US); Jay Paul John, Chandler, AZ (US); Steven Kwan, Austin, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/146,435

(22) Filed: Dec. 26, 2022

(65) Prior Publication Data

US 2023/0131166 A1 Apr. 27, 2023

Related U.S. Application Data

(62) Division of application No. 17/319,380, filed on May 13, 2021, now Pat. No. 11,569,357.

(51) Int. Cl.
| | |
|---|---|
| *H01L 29/423* | (2006.01) |
| *H01L 29/40* | (2006.01) |
| *H01L 29/45* | (2006.01) |
| *H01L 29/66* | (2006.01) |
| *H01L 29/737* | (2006.01) |

(52) U.S. Cl.
CPC ...... *H01L 29/42304* (2013.01); *H01L 29/401* (2013.01); *H01L 29/456* (2013.01); *H01L 29/66242* (2013.01); *H01L 29/7375* (2013.01)

(58) Field of Classification Search
CPC ............. H01L 29/42304; H01L 29/401; H01L 29/456; H01L 29/66242; H01L 29/7375
See application file for complete search history.

(56) References Cited

U.S. PATENT DOCUMENTS

| 6,177,717 B1 * | 1/2001 | Chantre | ............ H01L 29/66242 257/E29.035 |
|---|---|---|---|
| 2012/0199881 A1 * | 8/2012 | John | ...................... H01L 29/165 438/312 |

* cited by examiner

*Primary Examiner* — Syed I Gheyas

(57) ABSTRACT

A semiconductor device and a method of making a semiconductor device are described. The device includes an emitter. The device also includes a collector. The device further includes a base stack. The base is located between the emitter and the collector. The base stack includes an intrinsic base region. The device further includes a base electrode. The base electrode comprises a silicide. The silicide of the base electrode may be in direct contact with the base stack. The device may be a heterojunction bipolar transistor.

17 Claims, 3 Drawing Sheets

SEMICONDUCTOR DEVICE AND METHOD OF MAKING A SEMICONDUCTOR DEVICE

CROSS-REFERENCE TO RELATED APPLICATIONS

This application is a divisional claiming benefit of the filing date of prior U.S. patent application Ser. No. 17/319,380, filed May 13, 2021, the contents of which are incorporated by reference herein.

BACKGROUND

The present specification relates to a semiconductor device and to a method of making a semiconductor device.

For conventional semiconductor devices such as heterojunction bipolar transistors (HBTs), a significant component of the extrinsic base resistance arises from the silicon region between the base electrode silicide region and the intrinsic base region.

Significant work has been done in the semiconductor device industry to reduce this component of base resistance, in order to improve the radio frequency (RF) performance of such devices (e.g. fMAX, NFmin, etc.) for high frequency applications (e.g. 5G, 6G, automotive and other radar systems, etc.).

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
  an emitter;
  a collector;
  a base stack located between the emitter and the collector, wherein the base stack comprises an intrinsic base region; and
  a base electrode comprising a silicide, wherein the silicide of the base electrode is in direct contact with the base stack.

The semiconductor device may be provided on a major surface of a semiconductor die. A plane of contact between the silicide of the base electrode and the base stack may be oriented at a non-zero, non-orthogonal angle with respect to the major surface.

The silicide of the base electrode may extend between a part of the emitter and a part of the base.

The semiconductor device may be provided on a major surface of a semiconductor die. The collector may be located beneath the major surface. The base may be located above the collector. The emitter may be located above the base.

The base electrode may be located on one or more layers of dielectric, to electrically isolate the base electrode from the collector.

The semiconductor device may further include silicide on the emitter. The silicide of the emitter may be a same type of silicide as the silicide of the base electrode.

The silicide may comprise $CoSi_2$. The silicide may comprise NiSi. The silicide may comprise NiPtSi.

The base electrode may be in direct contact with an intrinsic base region of the base stack.

The semiconductor device may be a heterojunction bipolar transistor.

According to another aspect of the present disclosure, there is provided a method of making a semiconductor device, the method comprising:
  forming a collector;
  depositing a semiconductor layer;
  forming a base stack of the semiconductor device, wherein the base stack comprises an intrinsic base region, and wherein the semiconductor layer is in direct contact with the base stack;
  forming an emitter of the semiconductor device, wherein the base is located between the emitter and the collector;
  depositing a metallic portion on the semiconductor layer; and
  performing a silicidation process to form a silicide from the semiconductor layer and the metallic portion, wherein the silicide grows toward the base stack during said silicidation process to form a base electrode of the semiconductor device.

The method may include forming the device on a major surface of a semiconductor die. A plane of contact between the silicide of the base electrode and the base stack may be oriented at a non-zero, non-orthogonal angle with respect to the major surface.

The method may include depositing the metallic portion laterally separated from the base stack. The silicidation process may cause the silicide to grow towards and come into direct contact with the base stack. The silicidation process may cause the silicide to grow towards and come into direct contact with the intrinsic base region of the base stack.

The growth of the silicide towards the base stack may be driven by starvation of semiconductor material in parts of the semiconductor layer distal the base stack.

The silicide of the base electrode may extend between a part of the emitter and a part of the base.

The silicidation process may include a first thermal annealing process to produce a first phase material from the semiconductor layer and the metallic portion. The silicidation process may include a second thermal annealing process to produce the silicide from the first phase material.

The method may include an etch process after the first thermal annealing process to remove unreacted parts of the metallic portion before performing the second thermal annealing process.

The silicidation process may comprise a first (e.g. single) thermal annealing process to produce said silicide from the semiconductor layer and the metallic portion.

The method may include depositing one or more layers of dielectric prior to depositing the semiconductor layer in direct contact with the base stack, to electrically isolate the base electrode from the collector.

The silicidation process may also form an silicide on the emitter. The silicide of the emitter may be a same type of silicide as the silicide of the base electrode.

The metallic portion may comprise Co and the silicide may comprise $CoSi_2$. The metallic portion may comprise Ni and the silicide may comprise NiSi. The metallic portion may comprise NiPt and the silicide may comprise NiPtSi.

The semiconductor layer may have a thickness in the range 100-300 Å.

The semiconductor layer may comprise silicon.

The semiconductor device may be a heterojunction bipolar transistor.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
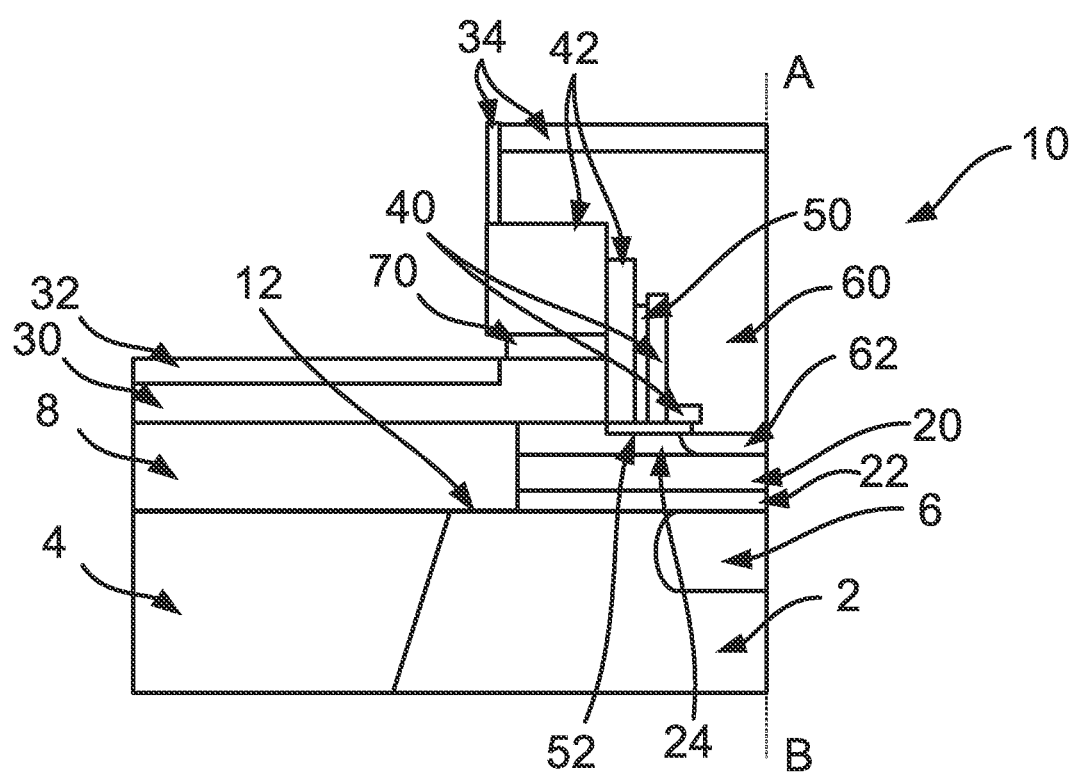
FIG. 1 shows an example of a heterojunction bipolar transistor.

FIG. 1 shows an example of a semiconductor device 10. In this example, the semiconductor device 10 is a heterojunction bipolar transistor. Note that, for simplicity, a left-hand side of the semiconductor device 10 is shown in FIG. 1. The right-hand side of the semiconductor device 10 may have substantially the same construction as the left-hand side—that is to say, the semiconductor device 10 may be substantially symmetrical around the line AB shown in FIG. 1.

The semiconductor device 10 is formed on a semiconductor substrate 2, which may comprise, for example, silicon. The semiconductor substrate 2 may include laterally located trenches 4 filled with dielectric. These trenches may serve to isolate the device from neighboring parts of the substrate, which may include other components. The trenches 4 may, for instance, comprise shallow trench isolation (STI).

The semiconductor substrate 2 has a major surface 12. The semiconductor device 10 includes a collector 6 located in the semiconductor substrate 2, beneath the major surface 12.

The semiconductor device 10 also has a base. The base stack in this example comprises a number of layers including a lower Si layer 22, a SiGe layer 20 and an upper Si layer 24. The base includes an intrinsic base region, which in the present example may comprise a doped (e.g. P-type) layer (e.g. boron doped), which may be contained in the SiGe layer 20.

The semiconductor device 10 also has an emitter 60. The emitter 60 in this example comprises polysilicon. The emitter 60 is located in an emitter window. The emitter window may be formed by various parts, including, for instance, nitride parts 40, 42 and oxide parts 50, 52. These parts may be considered to form a spacer for the emitter 60 and the base. The emitter window parts may comprise a nitride. The emitter 60 extends through the emitter window formed by the emitter window parts to contact the base.

The emitter window parts may be electrically isolated from the base by a layer 52 of dielectric (e.g. $SiO_2$, TEOS). The emitter window parts may also be electrically isolated from lateral parts 42 of the emitter stack by a dielectric portion 50 (e.g. $SiO_2$, TEOS). The lateral parts 42 may, for example, comprise a nitride.

In this example, the collector 6, the base and the emitter 60 are formed in a vertical stack with the base located beneath the emitter 60 and the collector 6 located beneath the base. The base may be located between laterally located dielectric parts 8. The laterally located dielectric parts 8 (comprising, for example, one or more dielectric layers) may serve to define the lateral extent of the base and may electrically isolate the base. The laterally located dielectric parts 8 may, for instance, comprise Tetraethyl orthosilicate (TEOS). The laterally located dielectric parts 8 may be located above the trenches 4.

The semiconductor device 10 further includes a base electrode. In this example, the base electrode includes two parts, namely a base silicon layer 30 and a silicide part 32. The silicon layer 30 may, for example, comprise polysilicon, amorphous silicon, or single crystal silicon. The base silicon layer 30 is located on the laterally located dielectric parts 8 and extends laterally across the semiconductor device 10 to contact the base. The base silicon layer 30 provides an electrical connection between the base and the silicide part 32. The silicide part 32 may provide a landing point for further (base) electrical connections to be made to the semiconductor device 10. The semiconductor device 10 further includes a dielectric layer 70. Dielectric layers 70, 42, 52, 50, 40 may all electrically isolate the base silicon layer 30 from the emitter 60.

Note that the emitter 60 may also comprise silicide parts 34, located on an upper surface and/or sidewall of the emitter 60 for providing an electrical connection to the emitter 60.

In the semiconductor device 10 shown in FIG. 1, a significant part of the extrinsic base resistance of the device 10 arises from the resistance of the base electrode, and in particular from the part of the base silicon layer 30 located between the silicide part 32 and the base. This contribution to the extrinsic base resistance of the semiconductor device 10 may have a deleterious on certain figures of merit (FOMs) of the semiconductor device 10, such as the maximum oscillation frequency $f_{MAX}$ and the minimum noise figure ($NF_{min}$), particularly for high frequency applications (e.g. 5G, 6G, automotive radar, etc.).

FIGS. 2-5 show a method of making a heterojunction bipolar transistor according to an embodiment of this disclosure.

Note that, for simplicity, a left-hand side of the semiconductor device 10 is shown in each of FIGS. 2-5. The right-hand side of the semiconductor device 10 may have substantially the same construction as the left-hand side—that is to say, the semiconductor device 10 may be substantially symmetrical around the line AB shown in FIGS. 2-5. The processing of the right-hand side of the semiconductor device 10 may match that described below in relation to the left-hand side of the semiconductor device 10.

At least some of the processing of the semiconductor device 10 may be conventional. It will be appreciated that, in the present embodiment, the structure of the features such as the emitter stack, the base, the collector and the substrate may be substantially as described above in relation to FIG. 1. In the following, the description will focus on the formation of the base electrode of the semiconductor device 10.

Figure 2:
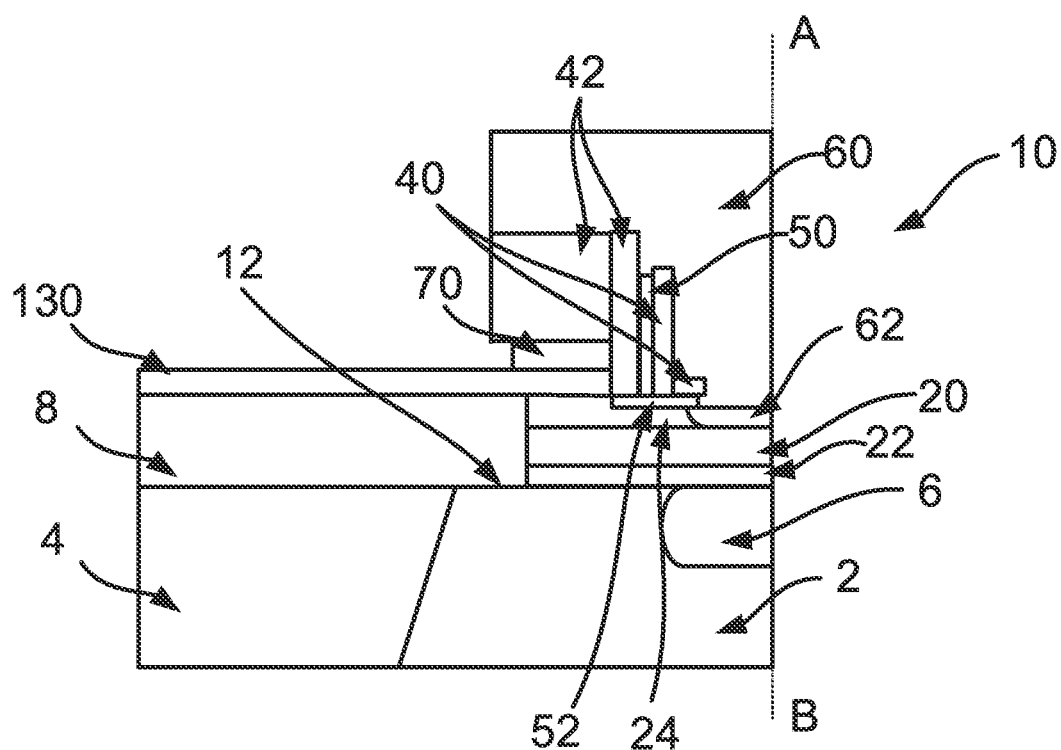
FIGS. 2-5 show a method of making a heterojunction bipolar transistor according to an embodiment of this disclosure.

FIG. 2 shows a first stage in the formation of the base electrode. Until this point, the method includes forming a collector, a base and an emitter of the semiconductor device 10, wherein the base is located between the emitter and the collector, and wherein the base comprises a base stack including an intrinsic base region. This may include the following stages.

Firstly, there may be provided a semiconductor substrate 2. The substrate 2 may comprise, for example, silicon. The substrate 2 may be provided with trenches 4 filled with dielectric (e.g. the trenches 4 may be formed using a shallow trench isolation (STI) process, although other processes are envisaged). The collector 6 may be formed at a major surface 12 of the semiconductor substrate 2 by doping a region of the semiconductor substrate 2 using, for example, an ion implantation process.

Thereafter, the laterally located dielectric parts 8 may be formed using, for example, a TEOS growth process. One or more masking and etching steps may be used to form an opening between a two laterally located dielectric parts 8 (e.g. the left-hand side laterally located dielectric part 8 and a similar right-hand side laterally located dielectric part not shown in the drawings) to accommodate the base.

The base may then be formed by depositing and doping semiconductor material into the opening between the two laterally located dielectric parts 8 to form a base stack including an intrinsic base region of the device 10. The deposition and doping steps may, for instance, form a base stack including the lower base layer 22 (comprising e.g. Si), the doped layer 20 (comprising e.g. SiGe) and the upper base layer 24 (comprising e.g. Si). The semiconductor device 10 may be heterojunction bipolar transistor, although it is also envisaged the semiconductor device 10 may be a bipolar transistor not including a heterojunction. The base stack includes an intrinsic base region, which in the present embodiment may comprise a doped (e.g. P-type) layer (e.g. boron doped), which may be formed by (or at least contained within) the doped layer 20.

The emitter stack may then be formed. This may involve a number of deposition and patterning steps, to form the dielectric layer 70 (comprising e.g. $SiO_2$), the dielectric layer 52 (comprising e.g. $SiO_2$), the nitride parts 40, the dielectric portion 50 (comprising e.g. SiO2) and the lateral parts 42 (comprising e.g. a nitride) of the emitter stack. In some embodiments, it is envisaged that parts of the emitter stack may be formed prior to the formation of the base. For instance, the dielectric layer 70 and part 42 above it may first be deposited and patterned, and a spacer (e.g. inner part 42) may be formed, followed by growth of the layers of the base stack.

The emitter may be formed by depositing, for example, polysilicon or amorphous silicon onto the emitter stack so as to fill the emitter window formed by the emitter window parts. The emitter may be in-situ doped. The deposited emitter material forms the emitter 60, which contacts the base through the emitter window. The emitter 60 and dielectric layers 42 and 70 may be patterned and removed over base electrode 130.

Thus, in this embodiment, the collector 6, the base and the emitter 60 are formed in a vertical stack with the base located beneath the emitter 60 and the collector 6 located beneath the base, as described above in relation to FIG. 1. It is envisaged, however, that embodiments of this disclosure would be applicable to other device structures, for instance non-vertical structures.

FIG. 2 illustrates an initial stage in the formation of a base electrode of the semiconductor device 10. In this stage, a semiconductor layer 130 is formed (e.g. deposited). While in the present example, the semiconductor layer is deposited after the formation of the base stack, in some embodiments, this ordering could be reversed, such that the base stack is formed after deposition of the semiconductor layer 130.

The semiconductor layer 130 may, for instance, comprise silicon (e.g. amorphous silicon, polysilicon or single crystal silicon). The semiconductor layer 130 may be doped (e.g. using boron, in the case of silicon). The doping of the semiconductor layer 130 may, for instance, be implemented in-situ, or using ion implantation.

The semiconductor layer 130 may, for instance, have a thickness in the range 100-300 Å. The semiconductor layer 130 is deposited such that it is in contact with the base stack. In the present embodiment, the semiconductor layer 130 is deposited onto the laterally located dielectric parts 8 and extends laterally across the semiconductor device 10 so as to make direct contact with the base stack. In particular, in the present embodiment, a medial part of the semiconductor layer 130 overlaps with the underlying upper upper base layer 24, thereby to make the aforementioned direct contact with the base stack.

The semiconductor layer 130 may be formed before the emitter stack is formed, so that the emitter stack does not interfere with the formation of the medial part of the semiconductor layer 130. For instance, the semiconductor layer 130 may be deposited and patterned prior to the formation of the dielectric layer 70 and the remainder of the emitter stack. In this way, the medial part of the semiconductor layer 130 may be formed to extend between a part of the emitter (stack) and a part of the base, and the dielectric layer 70 may be located on top of the semiconductor layer 130.

Figure 3:
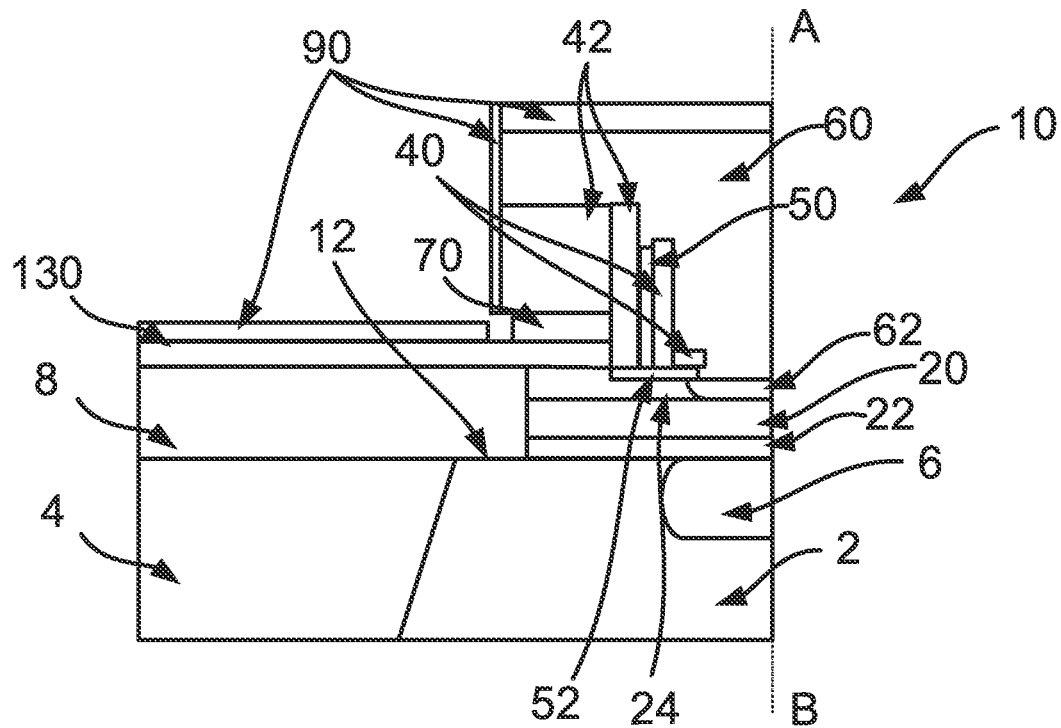

FIG. 3 illustrates a next stage in the formation of a base electrode of the semiconductor device 10. In this stage, a metallic portion 90 is deposited on the semiconductor layer 130. The metallic portion 90 may be in the form of a layer. The metallic portion may be deposited after the formation of the emitter stack. This may preclude the metallic portion from covering the medial parts of the semiconductor layer 130, as these medial parts may be masked by the lateral regions of the emitter stack. In some embodiments, the metallic portion 90 comprises Co. In some embodiments, the metallic portion 90 comprises Ni. In some embodiments, the metallic portion 90 comprises NiPt. Other metals or alloys are envisaged.

Figure 4:
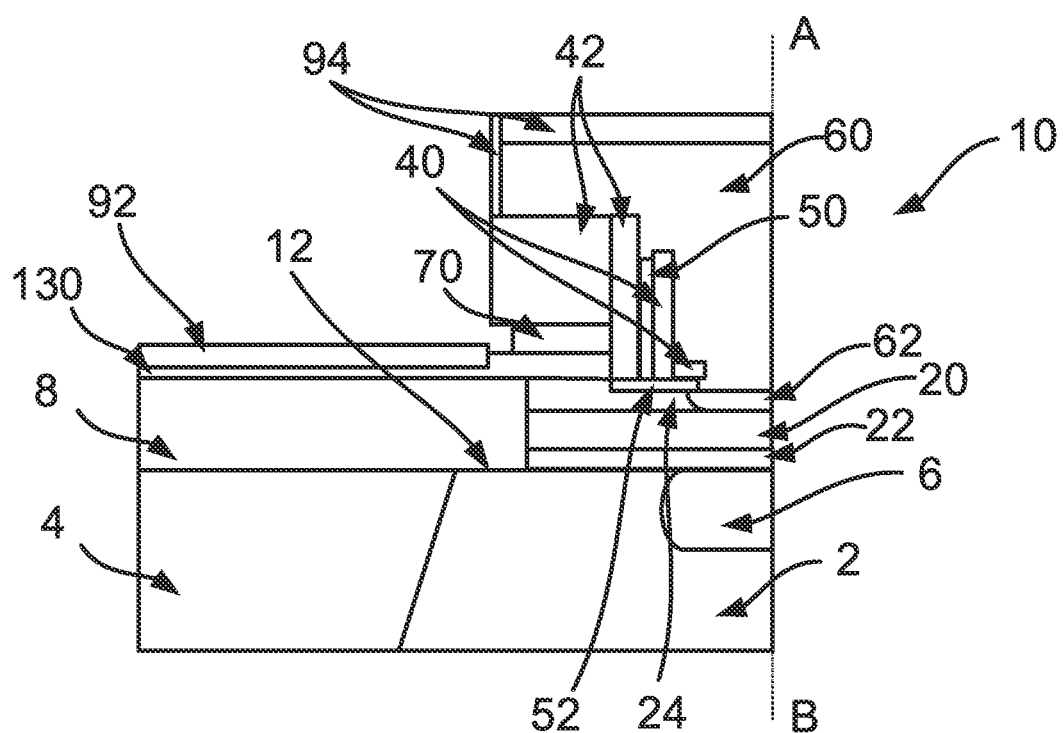
Figure 5:
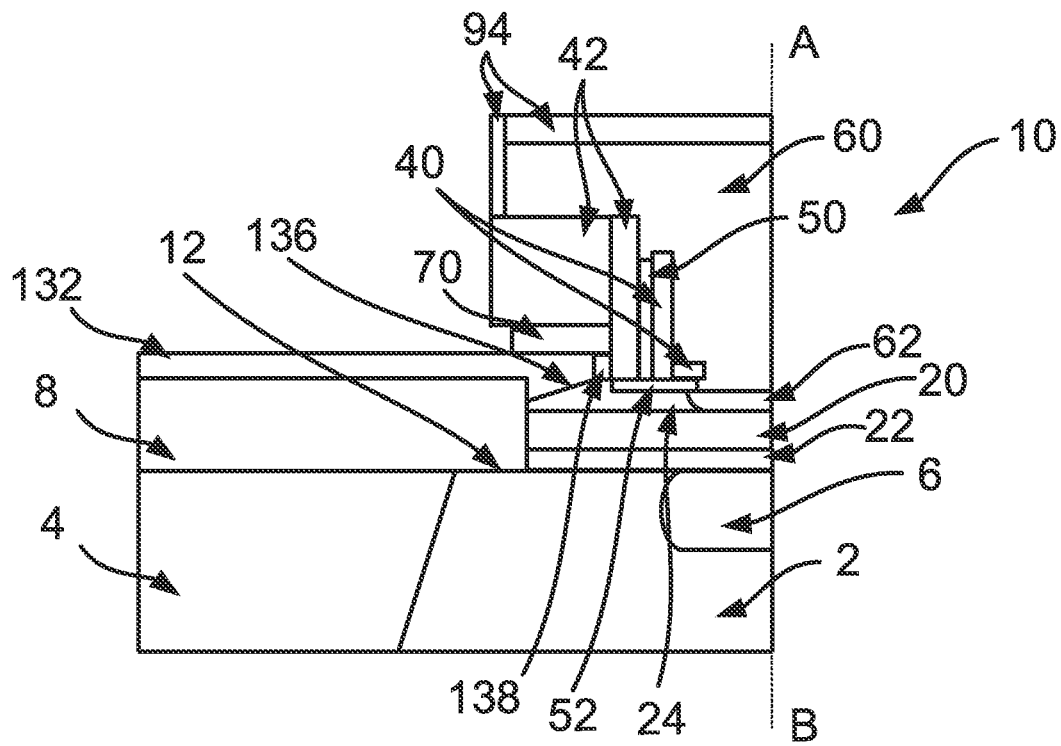

FIGS. 4 and 5 illustrates a next stage in the formation of a base electrode of the semiconductor device 10. In this stage, a silicidation process is performed, to react the metallic portion 90 with the semiconductor layer 130 to form a silicide. In one embodiment, where the semiconductor layer comprises silicon and the metallic portion 90 comprises Co, a $CoSi_2$ silicide may be formed. In another embodiment, where the semiconductor layer comprises silicon and the metallic portion 90 comprises Ni, a NiSi silicide may be formed. In a further embodiment, where the semiconductor layer comprises silicon and the metallic portion 90 comprises NiPt, a NiPtSi silicide may be formed.

The silicide forms the base electrode 132 of the semiconductor device 10 as shown in FIG. 5. Note that a medial part of the silicide of the base electrode 132 is in direct contact with the base stack. In the embodiment shown in FIG. 5, the silicide of the base electrode 132 is in direct contact with the upper base layer 24 of the base stack. It is envisaged that the silicide of the base electrode 132 may be in direct contact with the intrinsic base region (e.g. the doped layer 20). For instance, the silicide of the base electrode 132 may extend through one or more upper layers in the base stack (e.g. the upper layer 24) to reach the intrinsic base region (e.g. the doped layer 20).

Thus, unlike the example shown in FIG. 1, in the embodiment of FIG. 5 there is no contribution to the extrinsic base resistance of the semiconductor device 10 from a part of a base silicon layer 30 located between the silicide and the base stack. Because of this, the extrinsic base resistance of the semiconductor device 10 shown in FIG. 5 may be substantially lower than the extrinsic base resistance of the semiconductor device 10 shown in FIG. 1. This may lead to a corresponding improvement in certain figures of merit (FOMs) of the semiconductor device 10 in FIG. 5, such as the maximum oscillation frequency $f_{MAX}$ (noting that $f_{MAX} = [f_T/8\pi C_{CB}R_B]^{0.5}$, where $R_B$ is the base resistance, $C_{CB}$ is the collector-base capacitance and $f_T$ is the transit frequency) and the minimum noise figure ($NF_{min}$), particularly for high frequency applications (e.g. 5G, 6G, automotive radar, etc.).

The silicidation process shown in FIGS. 4 and 5 may (e.g. in the case of $CoSi_2$ silicide) include two thermal annealing processes (e.g. rapid thermal anneal (RTA) processes). The effect of the first thermal annealing process is shown in FIG. 4. The effect of the second thermal annealing process is shown in FIG. 5. In other embodiments (e.g. in the case of NiSi silicide) a single thermal annealing process (e.g. rapid thermal anneal (RTA) process) may be used.

In the first thermal annealing process of the two-step process shown in FIGS. 4 and 5, the metallic portion 90 reacts with the semiconductor layer 130 to form a first phase material 92. In embodiments in which the semiconductor layer 130 comprises silicon and the metallic portion 90 comprises Co, the first phase material 92 may comprise CoSi (for example, with the Si:Co ratio: 1.82). Note that in this first thermal annealing process, the footprint of the first phase material 92 may be much the same as that of the metallic portion 90. That is to say, there is little lateral diffusion of the Co within the silicon. In one embodiment, the first thermal annealing process may take place at a temperature in the range 400-600° C. and may consume ~1.82 nm of Si per nm of deposited Co.

Intermediate the first thermal annealing process and the second thermal annealing process, an etch process may be used to remove unreacted parts of the metallic portion 90.

In the second thermal annealing process a silicide (for example, $CoSi_2$ silicide, with the Si:Co ratio: 3.64) of the base electrode 132 is formed from the first phase material 92. During this process, the silicide grows initially in the vicinity of the first phase material 92. However, as the semiconductor material of the semiconductor layer 130 is exhausted in the vicinity of the first phase material 92, this starvation of the semiconductor material (due to the limited available volume/thickness of the semiconductor material) causes the silicide to grow laterally towards the base stack, consuming the semiconductor layer 130 until the silicide makes direct contact with the base stack (in particular, the upper base layer 24 in this embodiment). Note that this process allows the silicide of the base electrode 132 to be grown partially beneath the emitter stack. In some embodiments, a vestigial part 138 of the semiconductor layer 130 may remain in the vicinity of the base after the completion of the second thermal annealing process. Note that the base electrode 132 may be electrically isolated from the underlying substrate 2 (including the collector 6) by the laterally located dielectric parts 8. The base electrode 132 may also be electrically isolated from the emitter 60 by the lateral parts 42 of the emitter stack. In one embodiment, the second thermal annealing process may take place at a temperature in the range 600-800° C. and may consume ~3.64 m of Si per nm of deposited Co.

As noted above, in some embodiments, a one-step annealing process may be used to form the silicide following the deposition of the metallic portion 90. In one such embodiment, the metallic portion 90 may comprise Ni and the silicide formed may comprise NiSi. As with the above described two-step process, the one-step process may involve a (single) thermal annealing process (e.g. rapid thermal anneal (RTA) process). While the one-step process may involve a single thermal annealing process, the silicide formation may nevertheless pass through two phases. For instance, where the metallic portion 90 comprises Ni and the silicide comprises NiSi, an intermediate phase material ($Ni_2Si$) may be formed during the single thermal annealing process, which subsequently becomes NiSi during the same thermal annealing process. Typical process parameters of the thermal annealing process for forming NiSi may be a temperature of 400-600° C. consuming ~1.83 nm of Si per nm of deposited Ni.

In embodiments in which a one-step annealing process is used, the aforementioned etch process to remove unreacted parts of the metallic portion 90 may take place after the annealing step.

Where the silicide comprises NiPtSi, a one-step thermal annealing process of the kind described above may also be used, although it is envisaged that the thermal annealing process for NiPtSi may benefit from a wider temperature window.

As may be seen from FIG. 5, in this embodiment, a plane of contact 136 between the silicide of the base electrode 132 and the base stack is oriented at a non-zero, non-orthogonal angle with respect to the major surface 12 of the substrate 2. That is to say, in some embodiments, the thickness of a part of the silicide of the base electrode 132 which overlaps the base stack may increase with increasing distance from the center (e.g. center axis AB) of the semiconductor device 10. This variation in thickness may arise from the manner in which the silicide grows towards the base stack: as the silicide contacts the peripheral edge of the base stack, it may begin to grow vertically (towards the substrate 2) in addition to growing laterally. Note the silicide is unable to grow vertically until it reaches the base stack, owing the presence of the lateral laterally located dielectric parts 8. The extent of vertical growth of the silicide may be greater at the peripheral edges of the base stack because the time available for growth during the (e.g. second) thermal annealing process is greater. Note that the plane of contact 136 described above may result from either the two-step or one-step annealing processes described above.

A potential effect of this angled plane of contact 136 between the silicide of the base electrode 132 and the base stack is that the contact area between the silicide of the base electrode 132 and the base stack may be increased relative to embodiments in which the silicide has a constant thickness and the plane of contact 136 is substantially parallel (or perpendicular) to the major surface 12 of the semiconductor substrate 2. This may further reduce the extrinsic base resistance of the semiconductor device 10.

In some embodiments (which may involve either a two-step or one-step annealing process as described above), the silicide of the base electrode 132 grows through one or more upper layers (e.g. upper layer 24) of the base stack, to make direct contact with the intrinsic base region (e.g. the doped layer 20) of the base stack. This may still further reduce the base resistance of the device 10. Note that in such embodiments, the contact area sloped plane of contact described above may be the plane of contact between the silicide of the base electrode 132 and the intrinsic base region.

In some embodiments (which may involve either a two-step or one-step annealing process as described above), the silicidation process may also form an emitter silicide 94 of the semiconductor device 10. The silicide of the emitter silicide 94 may be a same type of silicide as the silicide of the base electrode 132.

As may be seen from FIG. 5, the method of making a semiconductor device 10 described herein may result in a semiconductor device 10 that has an emitter 60, a collector 6, a base having an intrinsic region that is located between the emitter 60 and the collector 6, and a base electrode 132 formed from a silicide. The silicide of the base electrode 132 is in direct contact with the base stack. Note that the dielectric layer 70 may electrically isolate a part of the base electrode 132 that is in direct contact with the base stack from the emitter 60.

Accordingly, there has been described a semiconductor device and a method of making a semiconductor device. The device includes an emitter. The device also includes a collector. The device further includes a base stack. The base stack is located between the emitter and the collector. The base includes an intrinsic base region. The device further includes a base electrode. The base electrode comprises a silicide. The silicide of the base electrode may be in direct contact with the base stack. For instance, the silicide of the base electrode may be in direct contact with the intrinsic base region of the base stack. The device may be a heterojunction bipolar transistor.

Although particular embodiments of this disclosure have been described, it will be appreciated that many modifications/additions and/or substitutions may be made within the scope of the claims.

The invention claimed is:

1. A semiconductor device comprising:
an emitter;
a collector;
a base stack located between the emitter and the collector, wherein the base stack comprises an intrinsic base region; and
a base electrode comprising a silicide, wherein the silicide of the base electrode is in direct contact with the base stack, the semiconductor device is provided on a major surface of a semiconductor die, and a plane of contact between the silicide of the base electrode and the intrinsic base region of the base stack is oriented at a non-zero, non-orthogonal angle with respect to the major surface.

2. The semiconductor device of claim 1, wherein the silicide of the base electrode extends between a part of the emitter and a part of the base stack.

3. The semiconductor device of claim 1, wherein the collector is located beneath the major surface, wherein the base stack is located above the collector, and wherein the emitter is located above the base stack.

4. The semiconductor device of claim 1, wherein the base electrode is located on one or more layers of dielectric, to electrically isolate the base electrode from the collector.

5. The semiconductor device of claim 1, further comprising additional silicide on the emitter, wherein the additional silicide on the emitter is a same type of silicide as the silicide of the base electrode.

6. The semiconductor device of claim 1, wherein the silicide comprises $CoSi_2$, NiSi or NiPtSi.

7. The semiconductor device of claim 1, wherein the base electrode is in direct contact with the intrinsic base region of the base stack.

8. The semiconductor device of claim 1, wherein a part of the base electrode in direct contact with the intrinsic base region of the base stack extends laterally beneath a dielectric layer, where the dielectric layer at least partially isolates the base electrode from the emitter.

9. A semiconductor device comprising:
a collector;
a base stack disposed over the collector, wherein the base stack comprises an intrinsic base region;
an emitter, wherein the base stack is disposed between the emitter and the collector; and
a silicide in direct contact with the base stack, wherein at least a portion of the silicide is disposed directly under the emitter, the semiconductor device is provided on a major surface of a semiconductor die, and a plane of contact between the silicide of the base electrode and the intrinsic base region of the base stack is oriented at a non-zero, non-orthogonal angle with respect to the major surface.

10. The semiconductor device of claim 9, further comprising:
one or more dielectric layers that electrically isolate the silicide from the collector.

11. The semiconductor device of claim 9, further comprising:
an additional silicide on the emitter, wherein the additional silicide on the emitter is a same type of silicide as the silicide in direct contact with the base stack.

12. The semiconductor device of claim 9, wherein the silicide comprises material selected from the group consisting of $CoSi_2$, NiSi, and NiPtSi.

13. The semiconductor device of claim 9, wherein the silicide is in direct contact with the intrinsic base region of the base stack.

14. The semiconductor device of claim 9, wherein at least a portion of the silicide extends laterally beneath a dielectric layer, the portion of the silicide is in direct contact with the base stack, and the dielectric layer at least partially isolates the silicide from the emitter.

15. A heterojunction bipolar transistor comprising:
a collector formed in a semiconductor substrate;
a base stack disposed over and at least partially in contact with the collector, wherein the base stack comprises an intrinsic base region; and
a base electrode comprising a silicide, wherein the silicide of the base electrode is in direct contact with the base stack, the semiconductor device is provided on a major surface of a semiconductor die, and a plane of contact between the silicide of the base electrode and the intrinsic base region of the base stack is oriented at a non-zero, non-orthogonal angle with respect to the major surface.

16. The heterojunction bipolar transistor of claim 15, wherein the base stack further comprises a first silicon layer disposed under the intrinsic base region and a second silicon layer disposed over the intrinsic base region, and the silicide of the base electrode is in direct contact with the intrinsic base region of the base stack.

17. The heterojunction bipolar transistor of claim 15, further comprising:
an emitter disposed over the base stack, wherein a location at which the silicide of the base electrode directly contacts the base stack is directly between the emitter and the collector.

* * * * *